United States Patent
Hatta et al.

(10) Patent No.: US 8,729,554 B2
(45) Date of Patent: May 20, 2014

(54) TOP-EMISSION ORGANIC LIGHT-EMITTING DIODE STRUCTURE

(75) Inventors: Yoshihisa Hatta, Miao-Li County (TW); Kazuchika Matsutani, Miao-Li County (TW); Pao-Chung Wu, Miao-Li County (TW)

(73) Assignee: Chimei Innolux Corporation (TW)

( * ) Notice: Subject to any disclaimer, the term of this patent is extended or adjusted under 35 U.S.C. 154(b) by 76 days.

(21) Appl. No.: 13/095,024

(22) Filed: Apr. 27, 2011

(65) Prior Publication Data

US 2012/0273817 A1    Nov. 1, 2012

(51) Int. Cl.
*H01L 27/14*   (2006.01)
*H01L 29/04*   (2006.01)
*H01L 29/15*   (2006.01)
*H01L 31/036*  (2006.01)

(52) U.S. Cl.
USPC ................................. 257/72; 257/E33.064

(58) Field of Classification Search
None
See application file for complete search history.

(56) References Cited

U.S. PATENT DOCUMENTS

| | | | |
|---|---|---|---|
| 7,023,131 B2 | 4/2006 | Chang et al. | |
| 7,109,652 B2 | 9/2006 | Tsai et al. | |
| 7,276,297 B2 | 10/2007 | Lee et al. | |
| 7,417,261 B2 | 8/2008 | Seo et al. | |
| 7,531,904 B2 | 5/2009 | Urabe et al. | |
| 2005/0046342 A1 | 3/2005 | Park et al. | |
| 2005/0224789 A1 | 10/2005 | Seo et al. | |
| 2006/0232199 A1 | 10/2006 | Takahashi | |
| 2007/0152572 A1* | 7/2007 | Kawakami et al. | 313/505 |
| 2007/0200123 A1 | 8/2007 | Yamamichi et al. | |
| 2008/0001153 A1* | 1/2008 | Urabe et al. | 257/59 |
| 2008/0169757 A1 | 7/2008 | Chang et al. | |
| 2008/0251785 A1* | 10/2008 | Noh et al. | 257/40 |
| 2009/0065942 A1* | 3/2009 | Inoue et al. | 257/765 |
| 2009/0115326 A1 | 5/2009 | Chan et al. | |
| 2009/0146559 A1 | 6/2009 | Chan et al. | |
| 2009/0174322 A1 | 7/2009 | Chan et al. | |
| 2009/0174630 A1 | 7/2009 | Chan et al. | |
| 2009/0224256 A1* | 9/2009 | Shin | 257/72 |

FOREIGN PATENT DOCUMENTS

TW    I272037    1/2007

* cited by examiner

*Primary Examiner* — Benjamin Sandvik
*Assistant Examiner* — Leslie Pilar Cruz
(74) *Attorney, Agent, or Firm* — Lowe Hauptman & Ham, LLP

(57) ABSTRACT

A top-emission organic light-emitting diode (OLED) structure is provided. The top-emission OLED structure includes a substrate, a reflective layer, a first conductive layer, a second conductive layer and an emissive layer. The reflective layer is disposed above the substrate. The reflective layer includes a first material, a second material and a third material. The first material is aluminum (Al), the second material is nickel (Ni), and the third material is selected form a group consisting of group 13 elements and group 14 elements of a periodic table of elements. The first conductive layer is disposed above the reflective layer. The second conductive layer is disposed above the first conductive layer. The emissive layer is disposed between the first conductive and the second conductive layer.

19 Claims, 2 Drawing Sheets

TOP-EMISSION ORGANIC LIGHT-EMITTING DIODE STRUCTURE

BACKGROUND OF THE DISCLOSURE

1. Field of the Disclosure

The disclosure relates in general to an organic light-emitting diode (OLED) structure, and more particularly to a top-emission OLED structure.

2. Description of the Related Art

As technologies progress, an organic light emitting diode (OLED) has become one of the most potential future lighting source. In the OLED, an emissive layer is sandwiched between two electrodes. At least one of the electrodes is partially light transmissive. These electrodes are referred to as an anode and a cathode. When the anode is connected to the positive terminal of a voltage source and the cathode is connected to the negative terminal, holes are injected from the anode into the emissive layer, and electrons are injected from the cathode. Combination of holes and electrons within the emissive layer results in emission of light.

Alternatively, in accordance with the luminescent path, OLED is classified into a bottom-emission OLED and a top-emission OLED. In a top-emission OLED, the electrode located at the top side is transparent and a reflective layer is located at the bottom side of the OLED, such that some of the light can pass through the electrode at the top side of the OLED and some of the light emitted to the bottom side can be reflected toward the top side. The reflectance of the reflective layer will affect the emission efficiency, as well as the power consumption.

In the OLED, the electric path is connected form the positive terminal to the negative terminal, and several layers are located on the electric path. The resistance of the layers will affect the power efficiency, as well as the emission efficiency. Accordingly, how to develop an OLED having low power consumption and high emission efficiency is a prominent goal for the industries.

SUMMARY OF THE DISCLOSURE

According to a first aspect of the present disclosure, a top-emission organic light-emitting diode (OLED) structure is provided. The top-emission OLED structure includes a substrate, a reflective layer, a first conductive layer, a second conductive layer and an emissive layer. The reflective layer is disposed above the substrate. The reflective layer includes a first material, a second material and a third material. The first material includes aluminum (Al), the second material includes nickel (Ni), and the third material is selected from a group consisting of group 13 elements and group 14 elements of a periodic table of elements. The first conductive layer is disposed above the reflective layer. The second conductive layer is disposed above the first conductive layer. The emissive layer is disposed between the first conductive and the second conductive layer.

The above and other aspects of the disclosure will become better understood with regard to the following detailed description of the preferred but non-limiting embodiment(s). The following description is made with reference to the accompanying drawings.

DETAILED DESCRIPTION OF THE DISCLOSURE

The following detailed description of the embodiments shows several top-emission organic light-emitting diode (OLED) structures. In order to realize high emission efficiency and low power consumption, some designs of layers of the OLED structures are provided. The embodiments are described as below, but it is not used to limit the present disclosure.

First Embodiment

Figure 1:
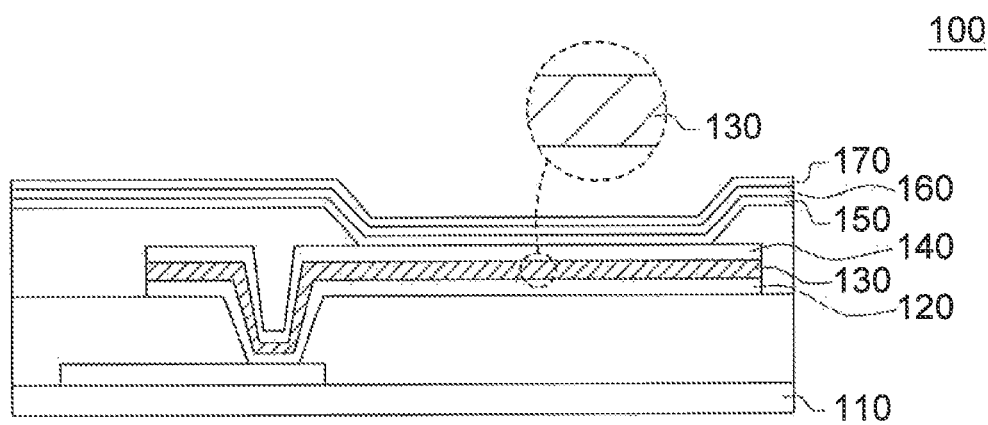
FIG. 1 is a schematic illustration showing a top-emission organic light-emitting diode (OLED) structure according to the first embodiment of the disclosure.

Referring to FIG. 1, FIG. 1 is a schematic illustration showing a top-emission organic light-emitting diode (OLED) structure 100 according to the first embodiment of the disclosure. The top-emission OLED structure 100 includes a substrate 110, a under layer 120, a reflective layer 130, a first conductive layer 140, an emissive layer 150, a second conductive layer 160 and a passivation layer 170. The substrate 110 as a backplane can be a glass, a plastic plate, a steel foil, or a silicon wafer, with a buffer layer.

The under layer 120 is disposed between the substrate 110 and the reflective layer 130. The melting point of the under layer 120 is larger than 600° C. substantially. For example, the under layer 120 can be formed of molybdenum (Mo), titanium (Ti), chromium (Cr), tantalum (Ta), tungsten (W) and a combination thereof. Due to the high melting point, the under layer 120 will not be melted during the process manufacturing the OILED structure 100.

The under layer 120 is used for firmly connecting the reflective layer 130 and the substrate 110. According to several experiments, when the thickness of the under layer 120 is larger than 10 nm substantially, the under layer 120 have a great adhesion force and a high electric conduction property.

In other embodiment, the reflective layer 130 can be directly disposed on and connected to the substrate 110 without the under layer 120.

In other embodiment, the under layer 120 can be made of oxide-based material, such as indium tin oxide (ITO), indium zinc oxide (IZO), InGaZnO$_4$ (IGZO), zinc oxide (ZnO), silver oxide, (Ag$_2$O) or molybdenum oxide (MoO, Mo$_2$O$_5$). The thickness of the under layer 120 is larger than 5 nm substantially.

The reflective layer 130 is disposed on the under layer 120 and above the substrate 110. Besides, reflective layer 130 is disposed between the first conductive layer 140 and the under layer 120. The reflective layer 130 at least includes a first material, a second material and a third material. The first material includes aluminum (Al), the second material includes nickel (Ni), and the third material is selected form a group consisting of group 13 elements and group 14 elements of a periodic table of elements. The group 13 elements include boron (B), gallium (Ga), indium (In) and titanium (Ti). The group 14 elements include carbon (C), silicon (Si), germanium (Ge), stannum (Sn) and plumbum (Pb). In one embodiment, the third material can be boron (B). That is to say, the reflective layer 130 can be an Al—Ni—B alloy layer. In another embodiment, the third material can be silicon (Si). That is to say, the reflective layer 130 can be an Al—Ni—Si alloy layer.

Referring to FIG. 1, in the present embodiment, the reflective layer 130 is a single-layer structure. The first material, the second material and the third material are distributed in whole of the reflective layer 130.

Some of the first material and some of the second material may be integrate into an integrated alloy, such as $AlNi_3$. It is acknowledge that Al is easy to be oxidized and the resistance of the oxidized aluminum is extremely high. However, $AlNi_3$ is not easy to be oxidized and the resistance of $AlNi_3$ is extremely low, therefore the resistance of the reflective layer 130 of the present embodiment can be kept at a low level and the power consumption of the OLED structure can be improved.

Figure 2:
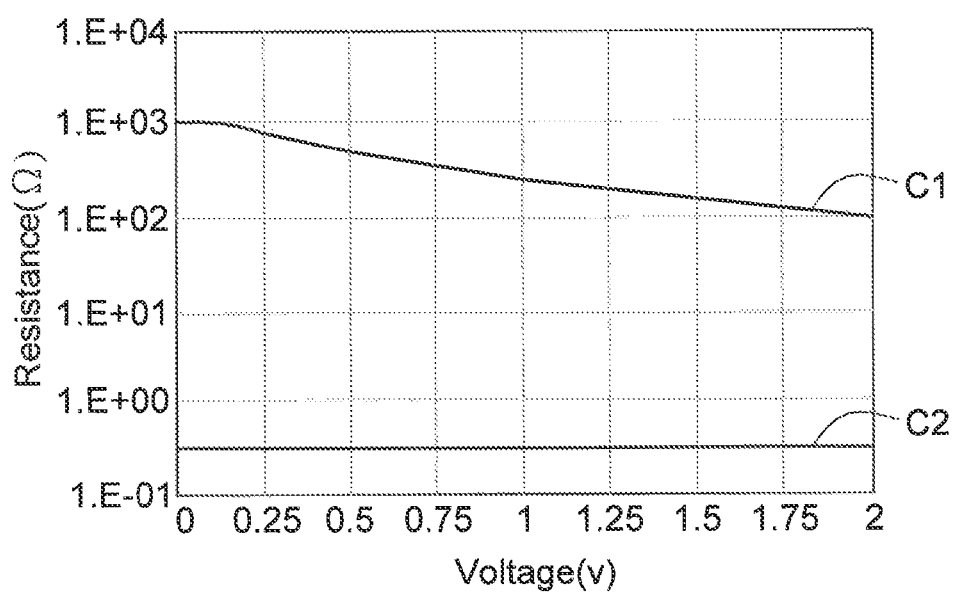
FIG. 2 shows a contact resistance curve of a reflective layer which is an Al—Nd alloy layer with a first conductive layer including ITO, and a contact resistance curve of a reflective layer which is an Al—Ni—B alloy layer with a first conductive layer including ITO.

Referring to FIG. 1 and FIG. 2, FIG. 2 shows a contact resistance curve C1 of a reflective layer 130 which is an Al—Nd alloy layer with the first conductive layer 140 including indium tin oxide (ITO), and a contact resistance curve C2 of a reflective layer 130 which is an Al—Ni—B alloy layer with the first conductive layer 140 including ITO. Based on the experiment, it is clear that the resistance of the curve C1 ranges from $1.E+03\ \Omega cm^2$ to $1.E+02\ \Omega cm^2$ and the resistance of the curve C2 ranges from $1.E+00\ \Omega cm^2$ to $1.E-01\ \Omega cm^2$. Thus, the resistance of the reflective layer 130 which is Al—Ni—B alloy layer with the first conductive layer 140 including ITO is lower and more stable than that of the reflective layer 130 which is Al—Nd alloy layer with the first conductive layer 140 including ITO.

Besides, when a current flows through the reflective layer 130 having low resistance, the power consumption of OLED can be kept at a low level.

Furthermore, the third material makes the surface of the reflective layer 130 become smooth. When the reflective layer 130 becomes smooth, the reflectance of the reflective layer 130 will be higher and the dark defect of the OLED structure 100 may be reduced.

Figure 3:
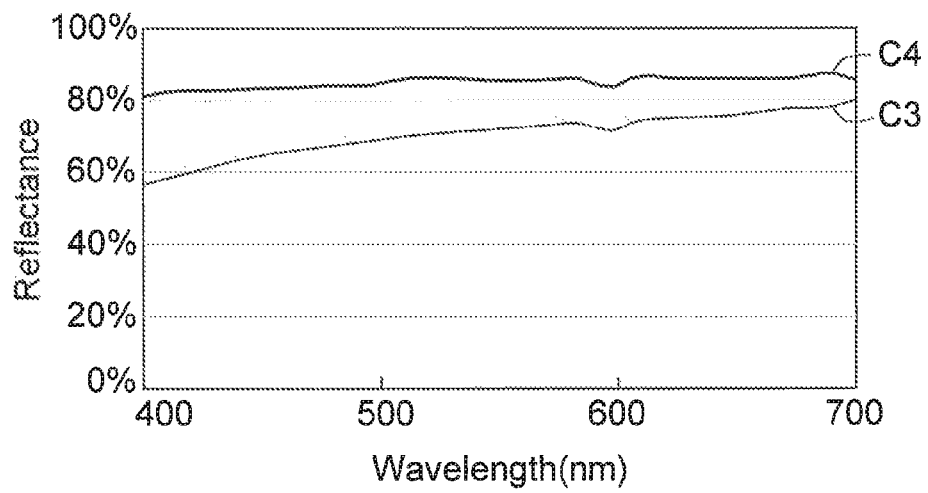
FIG. 3 shows a reflectance curve of a reflective layer which is an Al—Nd alloy layer with a first conductive layer including ITO and a reflectance curve of a reflective layer which is an Al—Ni—B alloy layer with a first conductive layer including ITO.

Referring to FIG. 1 and FIG. 3, FIG. 3 shows a reflectance curve C3 of a reflective layer 130 which is an Al—Nd alloy layer with the first conductive layer 140 including ITO and a reflectance curve C4 of a reflective layer 130 which is an Al—Ni—B alloy layer with the first conductive layer 140 including ITO. Base on the experiment, it is clear that the reflectance of the curve C3 ranges from 55% to 80% and the reflectance of the curve C4 ranges from 80% to 90%. Thus, the reflectance of the reflective layer 130 which is Al—Ni—B alloy layer with the first conductive layer 140 including ITO is higher than that of the reflective layer 130 which is Al—Nd alloy layer with the first conductive layer including 140 ITO.

In other embodiment, the reflective layer 130 may further include a fourth material which is a lanthanide element. The lanthanide element includes Lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu). The fourth material also can make the surface of the reflective layer 130 become smooth.

Regarding the concentration of the materials in the reflective layer 130, the concentration of the second material is less than 20% substantially, the concentration of the third material is less than 10% substantially, and the concentration of the fourth material is less than 10% substantially. Therefore, the first material may be a main element and the concentration of the first material may be the rest.

Regarding the thickness of the reflective layer 130, when the thickness of the reflective layer 130 is larger than 50 nm substantially, the reflective layer 130 will have good reflectance.

The reflective layer 130 is electronically connected to the first conductive layer 140. In the embodiment, the first conductive layer 140 may be an anode electrode of a pixel power line controlled by thin film transistor (TFT). The hole will inject into the emissive layer 150 through the reflective layer 130 and the first conductive layer 140.

The first conductive layer 140 is disposed above the reflective layer 130. The first conductive layer 140 is made of high work function material than that of Al, such as indium tin oxide (ITO), indium zinc oxide (IZO), $InGaZnO_4$ (IGZO), zinc oxide (ZnO), silver oxide, ($Ag_2O$) or molybdenum oxide (MoO, $Mo_2O_5$). For example, the work function of the first conductive layer 140 is larger than 4.5 eV substantially.

Regarding the thickness of the first conductive layer 140, the thickness of the first conductive layer 140 is less than 200 nm substantially. The thinner the first conductive layer 140 is the higher reflectance of the reflective layer 130 will be.

The emissive layer 150 is disposed on the first conductive layer 140 and disposed below the second conductive layer 160. The emissive layer 150 is made of organic material or inorganic material, such as silicon oxide (SiOx) or lithium (Li).

The second conductive layer 160 is disposed on the emissive layer 150 and above the first conductive layer 140. The second conductive layer 160 is made of oxide-based material, such as indium tin oxide (ITO), indium zinc oxide (IZO), $InGaZnO_4$ (IGZO), zinc oxide (ZnO), silver oxide, ($Ag_2O$) or molybdenum oxide (MoO, $Mo_2O_5$).

The passivation layer 170 is disposed on the second conductive layer 160. The passivation layer 170 is made of silicon oxide (SiOx), silicon nitride (SiNx), silicon oxynitride (SiONx) or organic material, such as methyl methacrylate (PMMA) or polyethylene terephthalate (PET).

According to the description, the aluminum (Al)-alloy reflective layer 130 of the top-emission OLED structure 100 is not easy to be oxidized and the resistance thereof can be kept at a low level. Furthermore, the surface smooth of the reflective layer 130 is smooth and the reflectance thereof can be kept at a high level. Therefore, the top-emission OLED structure 100 has high emission efficiency and low power consumption.

Second Embodiment

Figure 4:
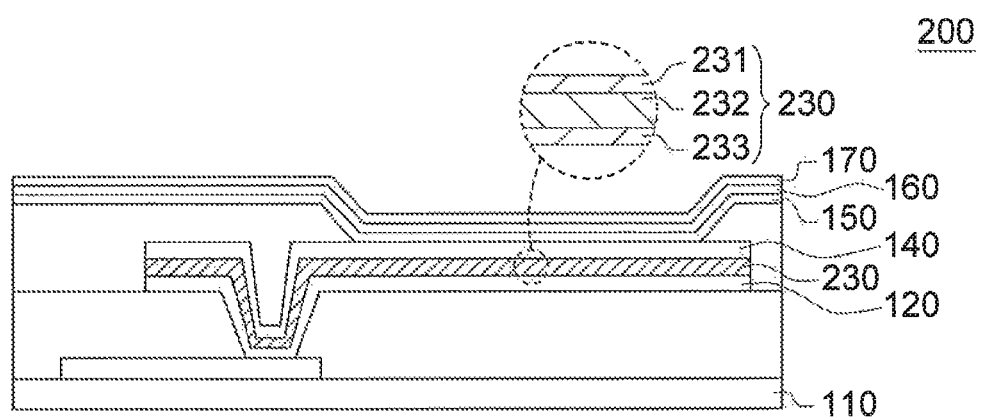
FIG. 4 shows a schematic illustration showing a top-emission organic light-emitting diode (OLED) structure according to the second embodiment of the disclosure.

Referring to FIG. 4, FIG. 4 shows a schematic illustration showing a top-emission organic light-emitting diode (OLED) structure 200 according to the second embodiment of the disclosure. The top-emission OLED structure 200 of the present embodiment of the disclosure differs with the top-emission OLED structure 100 of the first embodiment in that the reflective layer 230 is a multi-layer structure, and the second material is only distributed at the top and the bottom of the reflective layer 230.

In the present embodiment, the reflective layer 230 includes a first thin layer 231, a second thin layer 232 and a third thin layer 233. The second thin layer 232 is disposed between the first thin layer 231 and the third thin layer 233. The first thin layer 231 is made of the first material, the second material and the third material, and the third thin layer 233 is also made of the first material, the second material and the third material. The second thin layer 232 is made of the first material only, or made of the first material and a fifth material, such as neodymium (Nd). That is to say, the second material and the third material are only distributed at the top and the bottom of the reflective layer 230. In the other embodiment, the third thin layer 233 can also be ignored, and the second material and the third material are only distributed at the top of the reflective layer 230.

Because the second material is distributed at the top of the reflective layer 230, the resistance of the reflective layer 230 of the present embodiment can be kept at a low level and the power consumption of the OLED structure 200 can be improved.

Besides, because the third material is distributed at the top and the bottom of the reflective layer, the surface of the reflective layer 230 is smooth and the reflectance of the reflective layer 230 can be kept at a high level, such that the dark defect of the OLED structure 200 will be reduced.

While the disclosure has been described by way of example and in terms of the preferred embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A top-emission organic light-emitting diode (OLED) structure, comprising:
    a substrate;
    a reflective layer disposed above the substrate, wherein the reflective layer comprises a first material, a second material, a third material and a fourth material, the first material comprises aluminum (Al), the second material comprises nickel (Ni), the third material is selected from the group consisting of group 13 elements and group 14 elements of the periodic table of elements, and the fourth material comprises a lanthanide element;
    a first conductive layer disposed above the reflective layer;
    a second conductive layer disposed above the first conductive layer; and
    an emissive layer disposed between the first conductive layer and the second conductive layer.

2. The top-emission OLED structure according to claim 1, wherein the reflective layer is a single-layer structure, and the first material, the second material and the third material are distributed in whole of the reflective layer.

3. The top-emission OLED structure according to claim 1, wherein the reflective layer is a multi-layer structure, and the third material is distributed at a layer of the reflective layer closest to the emissive layer.

4. The top-emission OLED structure according to claim 3, wherein the layer of the reflective layer closest to the emissive layer further comprises the first material and the second material.

5. The top-emission OLED structure according to claim 1, wherein the third material comprises boron (B).

6. The top-emission OLED structure according to claim 1, wherein the third material comprises silicon (Si).

7. The top-emission OLED structure according to claim 1, wherein the concentration of the second material in the reflective layer is less than 20% substantially and the concentration of the third material in the reflective layer is less than 10% substantially.

8. The top-emission OLED structure according to claim 1, wherein the concentration of the fourth material in the reflective layer is less than 10% substantially.

9. The top-emission OLED structure according to claim 1, further comprising:
    an under layer, disposed between the substrate and the reflective layer;
    wherein the melting point of the under layer is larger than 600° C. substantially.

10. The top-emission OLED structure according to claim 9, wherein the under layer comprises at least one selected from the group consisting of molybdenum (Mo), titanium (Ti), chromium (Cr), tantalum (Ta) and tungsten (W).

11. The top-emission OLED structure according to claim 9, wherein the thickness of the under layer is larger than 10 nm substantially.

12. The top-emission OLED structure according to claim 1, further comprising:
    an under layer, disposed between the substrate and the reflective layer;
    wherein the under layer comprises indium tin oxide (ITO), indium zinc oxide (IZO), $InGaZnO_4$ (IGZO), zinc oxide (ZnO), silver oxide ($Ag_2O$), or molybdenum oxide (MoO, $Mo_2O5$).

13. The top-emission OLED structure according to claim 12, wherein the thickness of the under layer is larger than 5 nm substantially.

14. The top-emission OLED structure according to claim 1, wherein the first conductive layer comprises indium tin oxide (ITO), indium zinc oxide (IZO), $InGaZnO_4$ (IGZO), zinc oxide (ZnO), silver oxide ($Ag_2O$), or molybdenum oxide (MoO, $Mo_2O_5$).

15. The top-emission OLED structure according to claim 1, wherein the work function of the first conductive layer is larger than 4.5 eV substantially.

16. The top-emission OLED structure according to claim 1, wherein the thickness of the first conductive layer is less than 200 nm substantially.

17. The top-emission OLED structure according to claim 1, wherein the thickness of the reflective layer is larger than 50 nm substantially.

18. The top-emission OLED structure according to claim 1, wherein the reflective layer is electrically connected to the first conductive layer.

19. A top-emission organic light-emitting diode (OLED) structure, comprising:
    a substrate;
    a reflective layer disposed above the substrate, wherein the reflective layer comprises a first material, a second material and a third material, the first material comprises aluminum (Al), the second material comprises nickel (Ni), and the third material is selected from the group consisting of group 13 elements and group 14 elements of the periodic table of elements;
    a first conductive layer disposed above the reflective layer;
    a second conductive layer disposed above the first conductive layer; and
    an emissive layer disposed between the first conductive layer and the second conductive layer, wherein
    the reflective layer is a multi-layer structure, and
    a layer of the reflective layer closest to the emissive layer and a layer of the reflective layer farthest away from the emissive layer comprise the third material.

* * * * *